(12) United States Patent
Mason

(10) Patent No.: US 7,153,616 B2
(45) Date of Patent: Dec. 26, 2006

(54) SYSTEM AND METHOD FOR VERIFYING AND CONTROLLING THE PERFORMANCE OF A MASKLESS LITHOGRAPHY TOOL

(75) Inventor: Christopher J. Mason, Newtown, CT (US)

(73) Assignee: ASML Holding N.V. (NL)

( * ) Notice: Subject to any disclaimer, the term of this patent is extended or adjusted under 35 U.S.C. 154(b) by 277 days.

(21) Appl. No.: 10/812,977

(22) Filed: Mar. 31, 2004

(65) Prior Publication Data
US 2005/0219532 A1 Oct. 6, 2005

(51) Int. Cl.
G03C 5/00 (2006.01)
G03B 27/52 (2006.01)
G03B 27/42 (2006.01)

(52) U.S. Cl. ............... 430/5; 430/311; 355/30; 355/53

(58) Field of Classification Search ........... 250/492.22, 250/548; 345/84, 694; 347/256; 248/441; 349/2; 355/53–55, 75–77; 356/121–124, 356/400–401, 614–620; 359/204, 290–291, 359/572; 430/5, 22, 30, 311; 514/339
See application file for complete search history.

(56) References Cited

U.S. PATENT DOCUMENTS

| 5,229,872 | A |   | 7/1993  | Mumola         |           |
|-----------|---|---|---------|----------------|-----------|
| 5,296,891 | A |   | 3/1994  | Vogt et al.    |           |
| 5,500,736 | A |   | 3/1996  | Koitabashi et al. |        |
| 5,523,193 | A |   | 6/1996  | Nelson         |           |
| 5,530,482 | A |   | 6/1996  | Gove et al.    |           |
| 5,579,147 | A |   | 11/1996 | Mori et al.    |           |
| 5,677,703 | A |   | 10/1997 | Bhuva et al.   |           |
| 5,691,541 | A | * | 11/1997 | Ceglio et al.  | 250/492.1 |
| 5,808,797 | A |   | 9/1998  | Bloom et al.   |           |
| 5,982,553 | A |   | 11/1999 | Bloom et al.   |           |
| 6,122,397 | A |   | 9/2000  | Lee et al.     |           |

(Continued)

FOREIGN PATENT DOCUMENTS

WO    WO 98/04950    2/1998

(Continued)

OTHER PUBLICATIONS

"Micronic Laser Pattern Generators—Pattern Accuracy at the Speed of Light," *Micronic Laser Systems*, dated Nov. 2002, 2 pages, downloaded on Dec. 26, 2003 from <http://www.micronic.se/site_swe/litteratur/pdf/Sigma_Omega_product_sheet.pdf>.

(Continued)

*Primary Examiner*—Layla G. Lauchman
*Assistant Examiner*—J Underwood
(74) *Attorney, Agent, or Firm*—Sterne, Kessler, Goldstein & Fox PLLC

(57) ABSTRACT

A maskless lithography tool that includes a reference reticle having reference features for tuning and calibrating the tool. The reference reticle is illuminated by a illumination source to form a reference image of the reference features. A signal is applied to an active contrast device of the tool to form a die pattern that includes the reference features. The contrast device is illuminated by the illumination source to form a die image of reference features. An image scanner captures the reference image and the die image. A comparison of the images is used to make tuning and calibrating adjustments to the tool. The reference reticle can be used to debug and characterize the tool even when the operation of the contrast device is not completely understood because the reference features of the reference reticle are independent of the tool's contrast device and pattern generating data stream.

22 Claims, 9 Drawing Sheets

U.S. PATENT DOCUMENTS

| | | | |
|---|---|---|---|
| 6,133,986 A | 10/2000 | Johnson | |
| 6,177,980 B1 | 1/2001 | Johnson | |
| 6,215,578 B1 * | 4/2001 | Lin | 359/292 |
| 6,251,550 B1 | 6/2001 | Ishikawa | |
| 6,312,134 B1 | 11/2001 | Jain et al. | |
| 6,544,698 B1 | 4/2003 | Fries | |
| 6,628,372 B1 | 9/2003 | McCullough et al. | |
| 6,664,012 B1 * | 12/2003 | Nunes | 430/22 |
| 6,687,041 B1 | 2/2004 | Sandstrom | |
| 6,707,534 B1 * | 3/2004 | Bjorklund et al. | 355/53 |
| 6,747,783 B1 | 6/2004 | Sandstrom | |
| 6,794,100 B1 * | 9/2004 | Boettiger et al. | 430/30 |
| 6,795,169 B1 | 9/2004 | Tanaka et al. | |
| 6,806,897 B1 | 10/2004 | Kataoka et al. | |
| 6,811,953 B1 | 11/2004 | Hatada et al. | |
| 7,006,196 B1 | 2/2006 | Schroeder | |
| 2001/0033996 A1 * | 10/2001 | Lin | 430/311 |
| 2003/0077089 A1 | 4/2003 | Luellau | |
| 2003/0160980 A1 | 8/2003 | Olsson et al. | |
| 2003/0190535 A1 | 10/2003 | Fries | |
| 2004/0041104 A1 | 3/2004 | Liebregts et al. | |
| 2004/0130561 A1 | 7/2004 | Jain | |
| 2004/0239908 A1 * | 12/2004 | Bleeker et al. | 355/67 |
| 2005/0007572 A1 | 1/2005 | George et al. | |
| 2005/0047543 A1 | 3/2005 | Sandstrom | |
| 2005/0074906 A1 * | 4/2005 | Kochersperger | 438/7 |
| 2005/0219532 A1 * | 10/2005 | Mason | 356/401 |
| 2006/0033902 A1 | 2/2006 | Latypov et al. | |

FOREIGN PATENT DOCUMENTS

| | | |
|---|---|---|
| WO | WO 98/33096 | 7/1998 |
| WO | WO 98/38597 | 9/1998 |
| WO | WO 00/03307 | 1/2000 |

OTHER PUBLICATIONS

"A Little Light Magic," *IEEE Spectrum* (Sep. 2003), pp. 34-39.

* cited by examiner

SYSTEM AND METHOD FOR VERIFYING AND CONTROLLING THE PERFORMANCE OF A MASKLESS LITHOGRAPHY TOOL

FIELD OF THE INVENTION

The present invention relates generally to maskless lithography. More particularly, the present invention relates to a system and method for verifying and controlling the performance of a maskless lithography tool.

BACKGROUND OF THE INVENTION

Lithography is a process used to create features on the surface of substrates. Such substrates can include those used in the manufacture of flat panel displays, circuit boards, various integrated circuits, and the like. A frequently used substrate for such applications is a semiconductor wafer. During lithography, a wafer is disposed on a wafer stage and held in place by a chuck. The chuck is typically a vacuum or electrostatic chuck capable of securely holding the wafer in place. The wafer is exposed to an image projected onto its surface by exposure optics located within a lithography apparatus. While exposure optics are used in the case of photolithography, a different type of exposure apparatus can be used depending on the particular application. For example, x-ray, ion, electron, or photon lithographies each may require a different exposure apparatus, as is known to those skilled in the relevant art. The particular example of photolithography is discussed here for illustrative purposes only.

The projected image produces changes in the characteristics of a layer, for example photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove, dope, or otherwise affect exposed portions of underlying structural layers within the wafer, such as conductive, semiconductive, or insulative layers. This process is then repeated, together with other steps, until the desired features have been formed on the surface, or in various layers, of the wafer.

Step-and-scan technology works in conjunction with a projection optics system that has a narrow imaging slot. Rather than expose the entire wafer at one time, individual fields are scanned onto the wafer one at a time. This is done by moving the wafer and the reticle or light valve that defines the pattern simultaneously such that the imaging slot is moved across the field during the scan. The wafer stage must then be stepped between field exposures to allow multiple copies of a pattern to be exposed over the wafer surface.

Reticles (also known as masks or photomasks) are used to block photoresist exposure in selected areas, thus defining the pattern to be exposed. Reticles, and the use of reticles, can be expensive, especially for small wafer runs.

An alternative to using reticles is to use a maskless active contrast device called a spatial light modulator (SLM), such as a grating light valve (GLV) or a digital micromirror device (DMD) (also known as a digital micromirror array or a tilt-mirror array). A DMD is an array of a multitude of tiny mirrors, each mirror representing one pixel of a pattern. Each micromirror can be individually programmed to be turned on or off in real time using a high speed data stream, thereby allowing the micromirror array to be programmed to represent a desired pattern. When an individual micromirror is turned on, illumination energy is reflected by that mirror toward exposure optics and ultimately to a photoresist or substrate (e.g., a wafer or flat panel). When an individual micromirror is turned off, the illumination is not reflected toward the exposure optics and therefore is not then imaged onto the photoresist or substrate. In this way, the DMD becomes a maskless light valve. In some instances, it is possible that the mirrors may be commanded to states between on and off.

A lithography tool equipped with an SLM is typically referred to in the relevant art as a maskless lithography tool. A disadvantage of maskless lithography is that lithographic performance in a DMD equipped tool, for example, is dependent on the operation of the data path and mirror operation to generate reticle patterns, making separation of lithographic tool platform performance from lithographic tool reticle pattern performance difficult. In a DMD equipped tool, the reticle becomes a virtual device existing only at the instant of time the mirrors are commanded to deflect by the pattern generating stream and illumination energy is incident upon the mirrors. This makes lithography tool debugging and characterization difficult, particularly on a first of a kind tool, where pattern generation by means of mirror deflections is not completely understood due to a lack of experience.

What is needed is a maskless lithography system and method, without the disadvantages described above.

BRIEF SUMMARY OF THE INVENTION

The present invention is directed to a system and method for verifying and controlling the performance of a maskless lithography tool. In an embodiment, a maskless lithography tool according to the present invention includes a reference reticle. The reference reticle contains one or more fixed reference features that are independent of the tool's spatial light modulator (SLM) and the SLM's pattern generating data stream. This facilitates separating tool platform performance from reticle pattern generation. The reference reticle is used to perform various functions and/or tests such as wafer (or flat panel) exposures, aerial image scans, vibration measurements, and periodic calibrations that ensure the tool is operating as intended.

In an embodiment, the maskless lithography tool is adjusted using the reference reticle as follows. The reference reticle is illuminated with illumination energy emitted by an illumination source. A reference image of at least one reference feature of the reference reticle is formed from incident illumination energy using the tool's projection optics. A signal (e.g., one comprised of hundreds of interface signals) is applied to the tool's spatial light modulator to form a die pattern that includes the at least one reference feature. The spatial light modulator is illuminated with illumination energy emitted by the illumination source while the signal is applied to the spatial light modulator. A die image of at least one reference feature is formed from incident illumination energy with the projection optics. An image scanner detects the reference image and the die image. Adjustments are made to the tool based on a comparison of the die image and the reference image.

Because the fixed reference features of the reference reticle are independent of the tool's SLM and the SLM's pattern generating data stream, it is a feature of the present invention that the reference reticle can be used to debug and characterize the tool even when the operation of the SLM is not completely understood such as, for example, in the case of a new SLM or tool design.

Further embodiments, features, and advantages of the present invention, as well as the structure and operation of the various embodiments of the present invention, are described in detail below with reference to the accompanying drawings.

BRIEF DESCRIPTION OF THE FIGURES

The accompanying drawings, which are incorporated herein and form part of the specification, illustrate the present invention and, together with the description, further serve to explain the principles of the invention and to enable persons skilled in the pertinent art(s) to make and use the invention.

Figure 1:
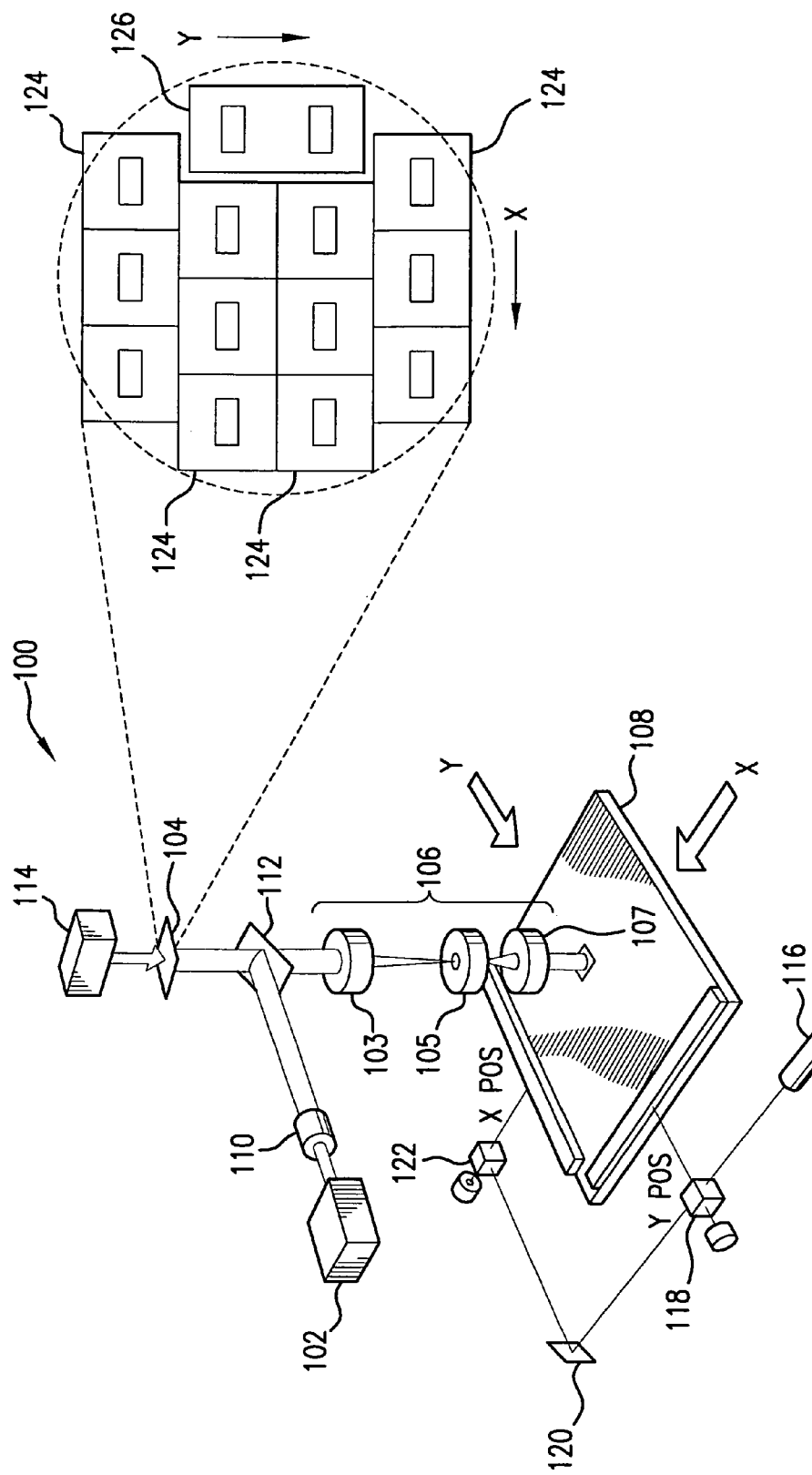
FIG. 1 is a schematic illustration of a maskless lithography tool according to an embodiment of the present invention.

The features and advantages of the present invention will become more apparent from the detailed description set forth below when taken in conjunction with the drawings in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

FIG. 1 illustrates a maskless lithography tool 100 according to an embodiment of the present invention. Tool 100 includes an illumination source 102, a spatial light modulator 104, projection optics 106, and a wafer stage 108.

In an embodiment, illumination energy emitted by illumination source 102 is conditioned by illumination optics 110. Illumination energy exiting illumination optics 110 is directed to spatial light modulator 104 using a beam-splitter 112. In an embodiment, illumination source 102 is a pulsed excimer laser. A continuous illumination source can be employed.

As illustrated in FIG. 1, spatial light modulator 104 is a reflective type spatial light modulator that includes a plurality of spatial light modulator cells 124 and a reference reticle 126, as shown in the blown-up portion of the figure. In the embodiment shown in FIG. 1, spatial light modulator 104 has twelve spatial light modulator cells 124. Other embodiments can have greater or fewer than twelve spatial light modulator cells 124. Reference reticle 126 includes fixed reference features that can be used to tune and calibrate tool 100. As shown in FIG. 1, reference reticle 126 is located in a plane with and proximate to at least one of the spatial light modulator cells 124. Embodiments of the present invention can have more than one reference reticle 126.

In embodiments, illumination energy from illumination source 102 can illuminate spatial light modulator cells 124 and reference reticle 126 either individually or simultaneously. To illuminate all of the cells and the reference reticle simultaneously, the illumination beam can be fractured into an appropriate number of smaller beams. An optional shutter (not shown) optically located between the illumination source 102 (or one of the fractured beams) and reference reticle 126 can be used to control the amount of illumination energy incident upon reference reticle 126 from the illumination source 102.

A pattern rasterizer 114 coupled to spatial light modulator 104 applies a signal to each of the spatial light modulator cells 124 to form a die pattern. In an embodiment, the signal is a stream of digital or analog data. When applied to spatial light modulator 104, the signal produces a linearized pattern bitmap. A signal applied to spatial light modulator cells 124 is used to generate a bitmap or die pattern of the fixed reference features of reference reticle 124. The structure and operation of spatial light modulator 104 is further described below with reference to FIGS. 2–6.

Illumination energy reflected from spatial light modulator 104 passes through beam-splitter 112 and enters projection optics 106. As shown in FIG. 1, in one embodiment, projection optics 106 includes a lens or lens group 103, an aperture 105, and a lens or lens group 107. A die image is formed using reflected illumination energy from spatial light modulator cells 124 that enters a pupil of projection optics 106. A reference image is formed using reflected illumination energy from reference reticle 126 that enters the pupil of projection optics 106.

Wafer stage 108 is moveable in the X and Y directions to permit step and scan lithography. The Y-direction position is controlled using motors (not shown) and interferometer 118. The X-direction position is controlled using motors (not shown) and interferometer 122. A laser 116 and a beam-splitter 120 are used to provide illumination to interferometer 118 and interferometer 122. The images formed by projection optics 106 can be located at different areas of wafer stage 108 by changing the position of wafer stage 108.

An image scanner (see FIG. 9) is used to detect the die image and the reference image. In an embodiment, the image scanner is a photosensitive device that produces an electronic signal proportional to the intensity of the image being scanned. In an embodiment, the die image and the reference image are wafer plane or resist images. In other embodiments, the die image and the reference image are three-dimensional aerial images.

A comparator (see FIG. 9) coupled to the image scanner compares the die image to the reference image. In one embodiment, the comparator generates image quality metrics that are known in the relevant art and compares these metrics using conventional comparison techniques. In an embodiment, an adjustment control coupled to the comparator automatically adjusts the tool based on an output of the comparator. In embodiments, the tool is adjusted by adjusting the illumination source, the spatial light modulator, the projection optics, and/or the wafer stage. Periodic adjustments to the tool can be made, for example, at least once during the processing of each lot of substrates. In a preferred embodiment, these periodic adjustments are made once every 30 seconds to once every five minutes.

In an embodiment of the present invention, a spatial light modulator is used that controls the transmission or passage of illumination energy rather than the reflection of illumination energy. In this embodiment, the illumination optics are rearranged to appropriately illuminate the spatial light modulator.

Figure 2:
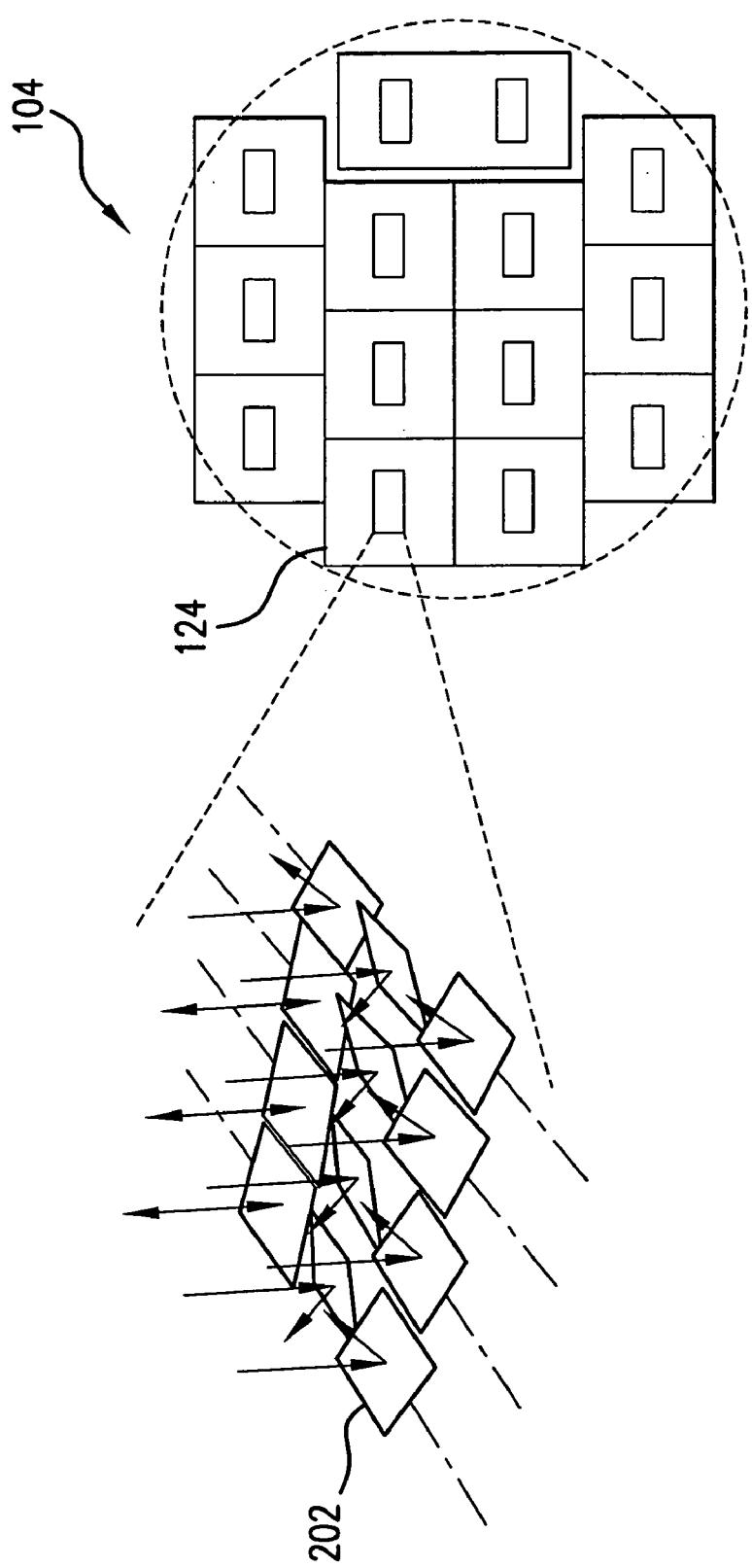
FIG. 2 is a schematic illustration of a spatial light modulator according to an embodiment of the present invention.

FIG. 2 is a more detailed schematic illustration of spatial light modulator 104. As shown in FIG. 2, each spatial light modulator cell 124 includes a plurality of pixel modulators 202. In an embodiment, a pixel modulator 202 reflects illumination energy either parallel to an incident illumination ray or at some angle to the incident illumination ray. In an embodiment, an on-pixel is one that reflects illumination energy parallel to an incident illumination ray.

Figure 3:
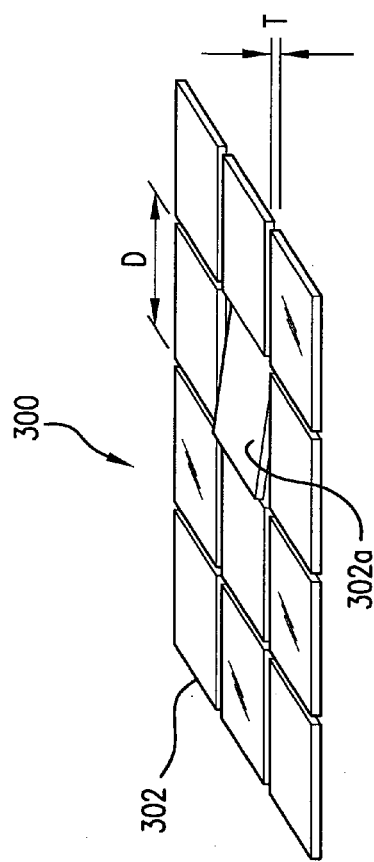
FIG. 3 is a schematic illustration of a portion of a spatial light modulator cell according to an embodiment of the present invention.

FIG. 3 is a schematic illustration of a portion of a tilting mirror spatial light modulator cell 300 according to an embodiment of the present invention. Tilting mirror spatial light modulator cell 300 is shown comprising twelve mirrors 302. Each mirror 302 has a side length of D. In one embodiment, the length D is approximately 16 micrometers. In another embodiment, the length D is approximately 8 micrometers. A pixel represented by a mirror 302 can be turned off, for example, by tilting the mirror the mirror a distance T as represented by mirror 302a. In a preferred embodiment, the distance T is approximately 0.062 micrometers. In a typical embodiment, a tilting mirror spatial light modulator cell 300 according to an embodiment of the present invention would have 1000 or more mirrors 302.

Figure 4:
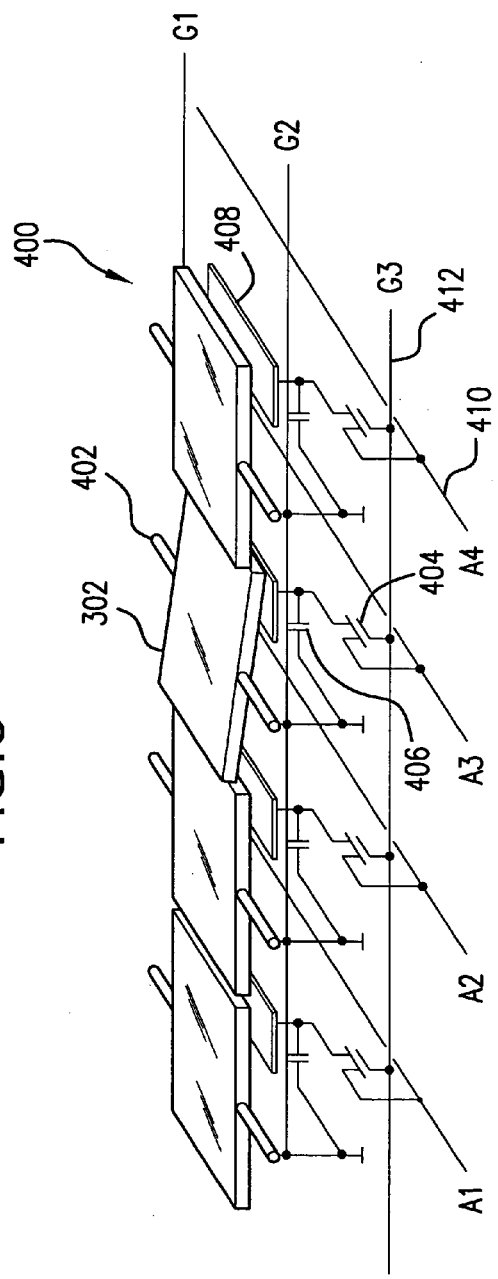
FIG. 4 is a schematic illustration of an addressing circuit for the spatial light modulator cell of FIG. 3.

FIG. 4 is a schematic illustration of an addressing circuit 400 for tilting mirror spatial light modulator cell 300. The circuit 400 is used to tilt each mirror 302 about an axis 402. The circuit comprises a plurality of transistors 404, capacitors 406, tilting pads 408, and addressing lines 410 and 412. As would be understood by a person skilled in the relevant art(s) given the description herein, by applying appropriate signals to the addressing lines 410 and 412, the tilting of each individual mirror 302 can be controlled. Of course, other SLM's or contrast devices can be employed.

Figure 5:
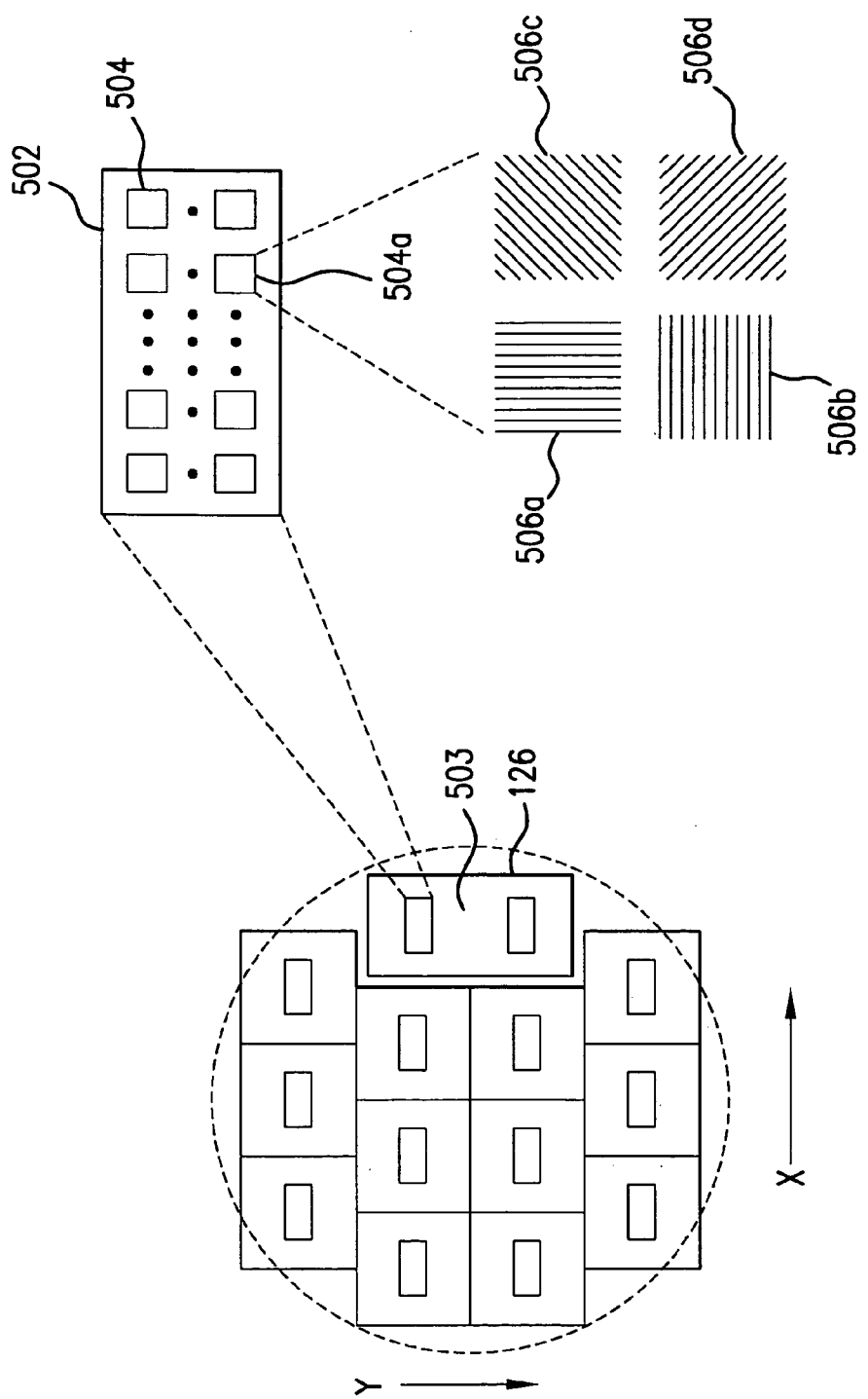
FIG. 5 is a schematic illustration of a reference reticle according to an embodiment of the present invention.

FIG. 5 is a schematic illustration of a reference reticle 126 according to an embodiment of the present invention. As shown in FIG. 5, reference reticle 126 has two major regions 502 on a single plate 503. In embodiments, plate 503 can be tilted to direct incident illumination energy away from the pupil of projection optics 106 as described further below with reference to FIG. 10. Each major region 502 includes a plurality of subregions 504 having reference features 506. In the exemplary embodiment of FIG. 5, subregion 504a has four reference features 506a, 506b, 506c, and 506d. Feature 506a is a series of parallel lines running in the Y-direction. Feature 506b is a series of parallel lines running in the X-direction. Feature 506c is a series of parallel lines running at a 45 degree diagonal to the Y-direction. Feature 506d is a series of lines running perpendicular to the lines of feature 506c. As would be known to persons skilled in the relevant art(s), these four line orientations are useful for setting up and calibrating a lithography tool. Additional lines having different orientations can be included in other subregions 504, for example, to evaluate stitching operations. In an embodiment, the features of reference reticle 126 are formed using clear openings in a chrome mask. However, any known means can be used to form the features of a reference reticle, including a grating.

Figure 6:
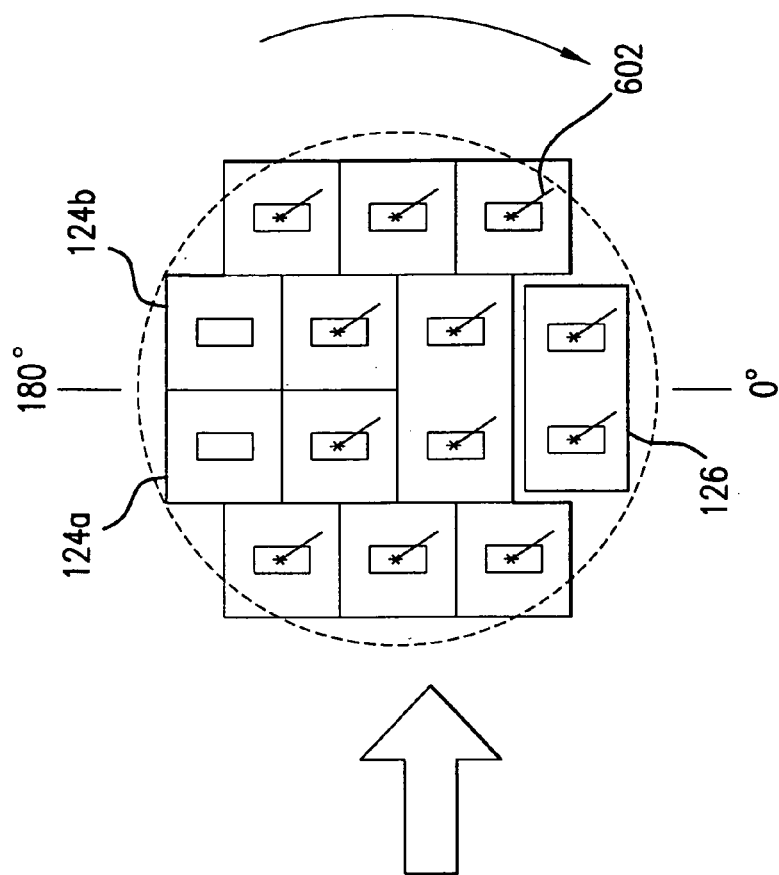
FIG. 6 is a schematic illustration of a method for changing the illumination of the spatial light modulator of FIG. 2.
Figure 6:
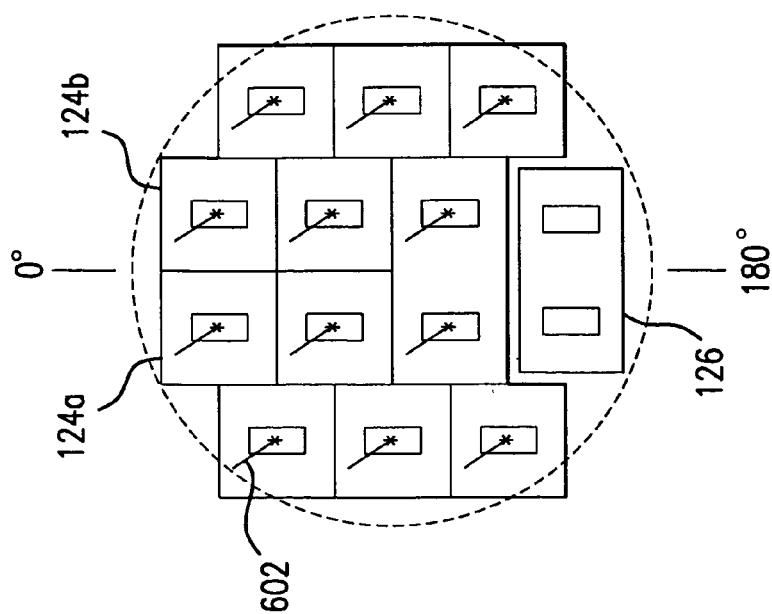

FIG. 6 is a schematic illustration of an exemplary method for changing the illumination of spatial light modulator 104. The left hand side of FIG. 6 shows twelve beams of light 602 illuminating each of the twelve spatial light modulator cells 124 of spatial light modulator 104. The twelve beams of light 602 can be formed, for example, by fracturing the illumination beam emitted by illumination source 102. The right hand side of FIG. 6 shows the result of rotating the illumination by 180 degrees relative to spatial light modulator 104. This rotation can be achieved, for example, by rotating at least a portion of the system that produces the twelve beams of light 602 and/or spatial light modulator 104. After the rotation, two of the twelve beams that initially illuminated spatial light modulator cells 124a and 124b now illuminated reference reticle 126, and the spatial light modulator cells 124a and 124b are no longer illuminated. As will be understood by persons skilled in the relevant art(s), the method illustrated by FIG. 6 is an alternative to shuttering reference reticle 126.

Figure 7:
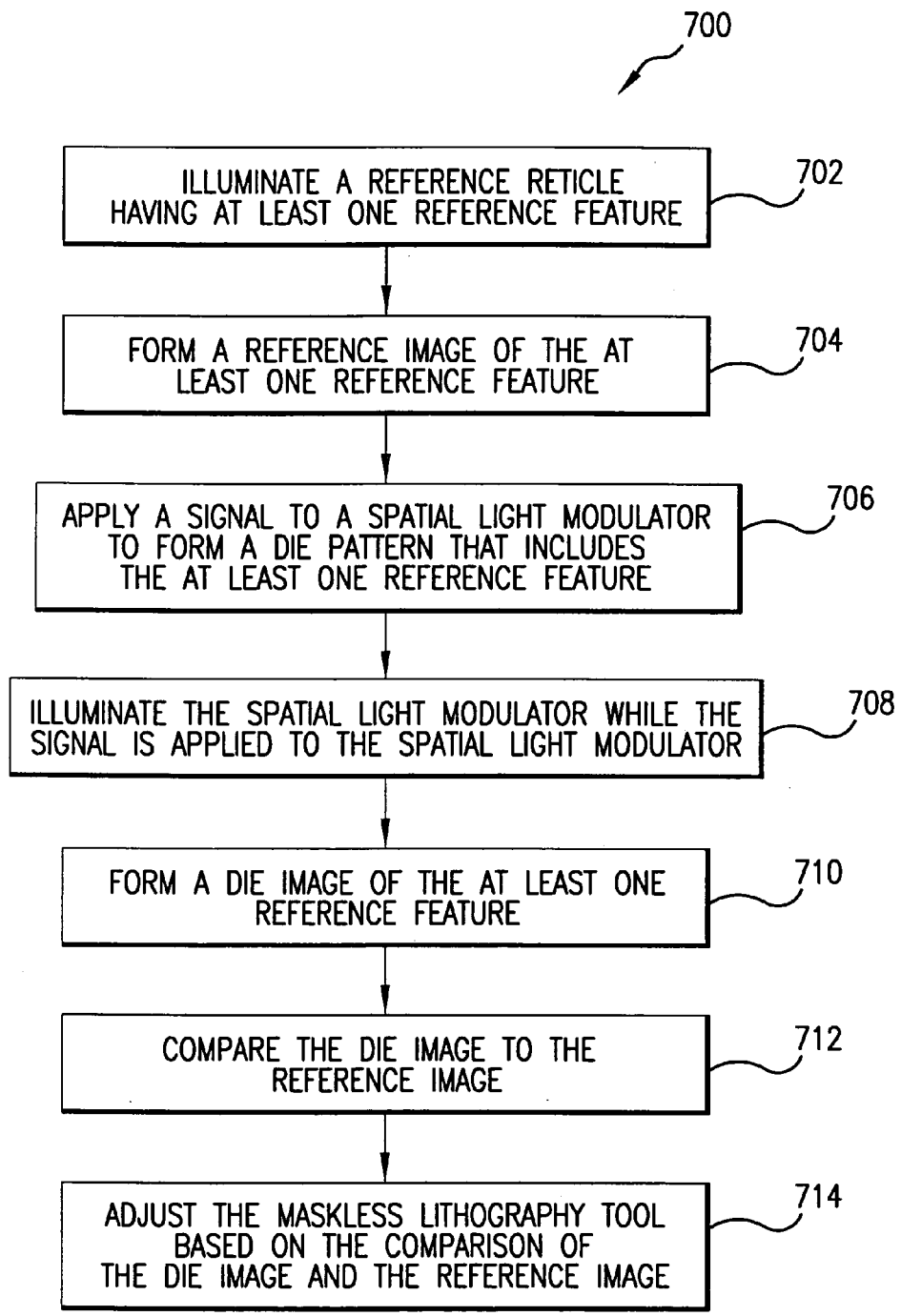
FIG. 7 is a flowchart of a method for adjusting a maskless lithography tool according to an embodiment of the invention.

FIG. 7 is a flowchart of a method 700 for adjusting a maskless lithography tool according to an embodiment of the invention. Method 700 can be implemented using a maskless lithography system or tool that includes an illumination source, a spatial light modulator, a reference reticle having at least one reference feature, and projection optics having a pupil. In an embodiment, the reference reticle is illuminated by the illumination source to form a reference image of at least one reference feature. A signal is applied to the spatial light modulator to form a die pattern that includes the at least one reference feature. The spatial light modulator is illuminated by the illumination source to form a die image of the at least one reference feature. An image scanner captures features of the reference image and the die image. A comparison of the images is made and used to adjust the tool. Method 700 can be used to debug and characterize the tool even when the operation of the spatial light modulator is not completely understood because the reference features of the reference reticle are time invariant and independent of the tool's spatial light modulator and pattern generating data stream.

The steps of method 700 will now be described individually. Method 700 starts with step 702.

In step 702, the reference reticle having at least one reference feature is illuminated. The illumination energy to illuminate the reference reticle is emitted by the illumination source. In an embodiment, the illumination energy is conditioned before it illuminates the reference reticle.

In step 704, a reference image of the at least one reference feature of the reference reticle is formed. The reference image is formed with illumination energy from the reference reticle that enters the pupil of the projection optics. The image that is formed can be a resist or wafer plane image or an aerial image. The reference image of the at least one reference feature is not dependent upon the spatial light modulator and its supporting components.

In step 706, a signal is applied to the spatial light modulator to form a die pattern that includes the at least one reference feature. In an embodiment, the applied signal is a rasterization signal comprising a stream of data. This stream of data is applied to the address lines of a control circuit that positions individual pixel modulators of the spatial light modulator cells that make up the spatial light modulator.

In step 708, the spatial light modulator is illuminated while the signal is applied to the spatial light modulator. The spatial light modulator is illuminated with illumination energy emitted by the illumination source.

In step 710, a die image of at least one reference feature is formed. The die image is formed with illumination energy from the spatial light modulator that enters the pupil of the projection optics. The die image can be either a resist or wafer plane image or an aerial image.

In step 712, the die image is compared to the reference image. In an embodiment, a resist or wafer plane die image of the at least one reference feature is compared to a resist or wafer plane reference image of the at least one reference feature. In another embodiment, an aerial die image of the at least one reference feature is compared to an aerial reference image of the at least one reference feature. The comparison can comprise processing the images and comparing the processed signals as would be understood by persons skilled in the relevant art(s) given the description herein.

In step 714, adjustments to the maskless lithography system or tool are made based on the comparison results of step 712. The adjustments can be made manually by technicians, or automatically by an adjustment control system.

In an embodiment, steps 702–714 are performed in a loop that is completed periodically to ensure proper operation of the tool.

In an embodiment, it is a feature that the reference reticle is shuttered, for example, when it is not needed to implement method 700. Shuttering the reference reticle prevents illumination (and thus prevents imaging into the wafer plane) of the reference reticle by illumination energy emitted from the illumination source.

In another embodiment, it is a feature that the reference reticle is positioned to reflect incident illumination energy from the illumination source away from the pupil of the projection optics, for example, when reference reticle is not needed to implement method 700. The reflected illumination can be detected and measured using an illumination monitor. The output of the illumination monitor can then be used to adjust the intensity of the illumination energy emitted by the illumination source. The intensity of the illumination energy measured by the illumination monitor also can be recorded and used for diagnostic purposes (e.g., long term monitoring of the illumination source).

In still another embodiment, an energy sensor is located behind or within the reference reticle. Measuring energy transmitted through the reference reticle may be preferred over reflecting energy onto another detector in certain applications.

It is a feature of method 700 that, in embodiments of the present invention, the reference reticle and the spatial light modulator are mounted on a movable surface (e.g., a surface that can be tilted in one or more dimensions). The reference image of the at least one reference feature can be monitored during movement or tilting of the moveable table to determine the effects of the tilting. If the reference image is an aerial image, the aerial image can be observed and used to position the movable surface to achieve a desired telecentricity.

Further features of method 700 will become apparent to persons skilled in the relevant art(s) given the description herein.

Figure 8:
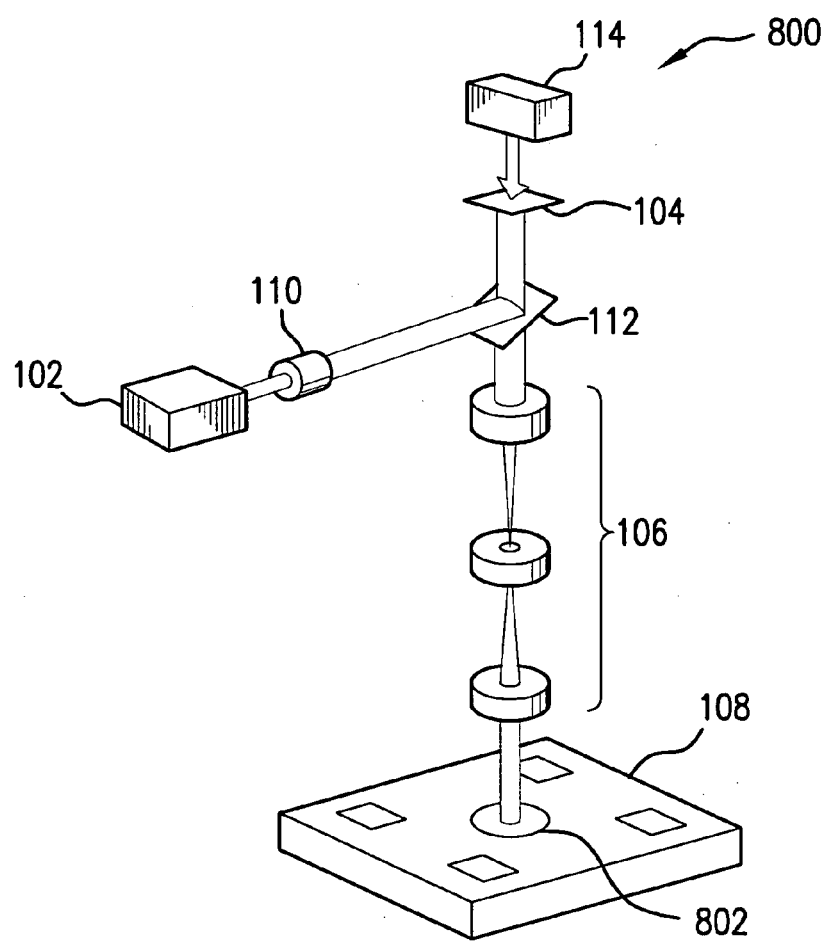
FIG. 8 is a schematic illustration of a resist image test according to an embodiment of the present invention.
Figure 9:
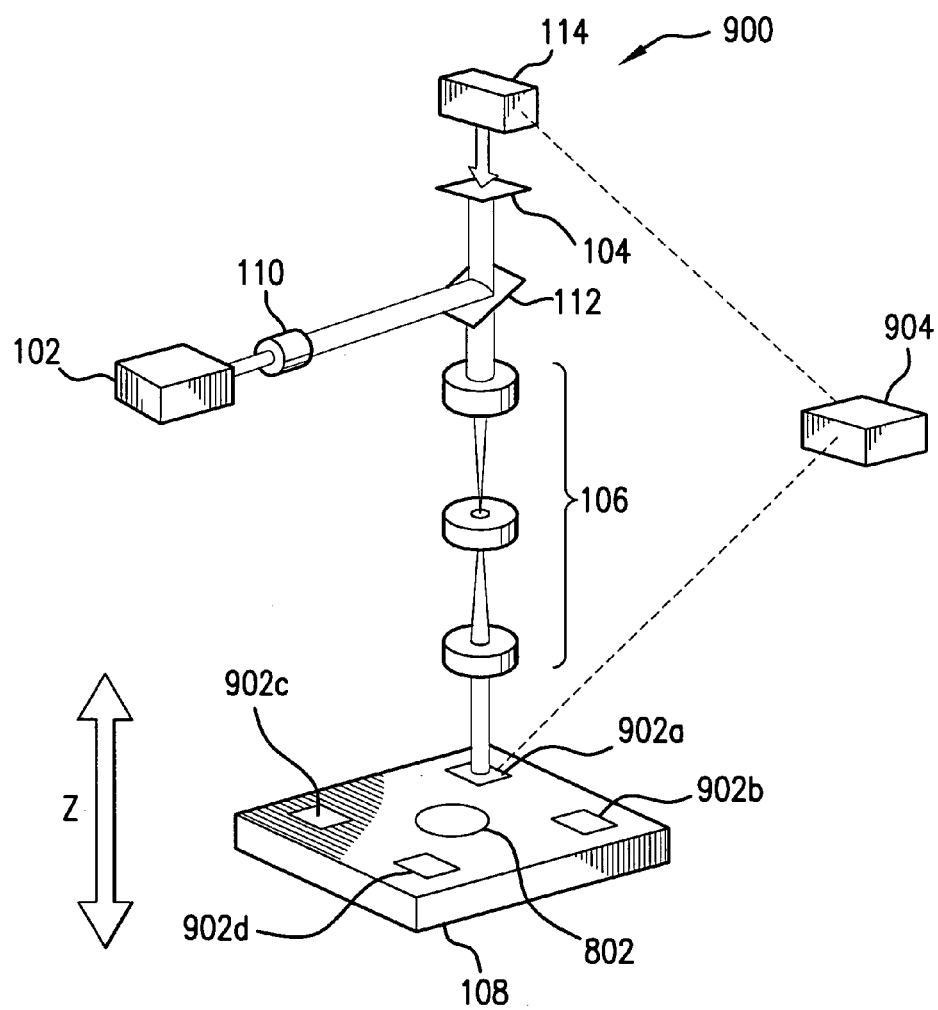
FIG. 9 is a schematic illustration of an aerial image test according to an embodiment of the present invention.
Figure 10:
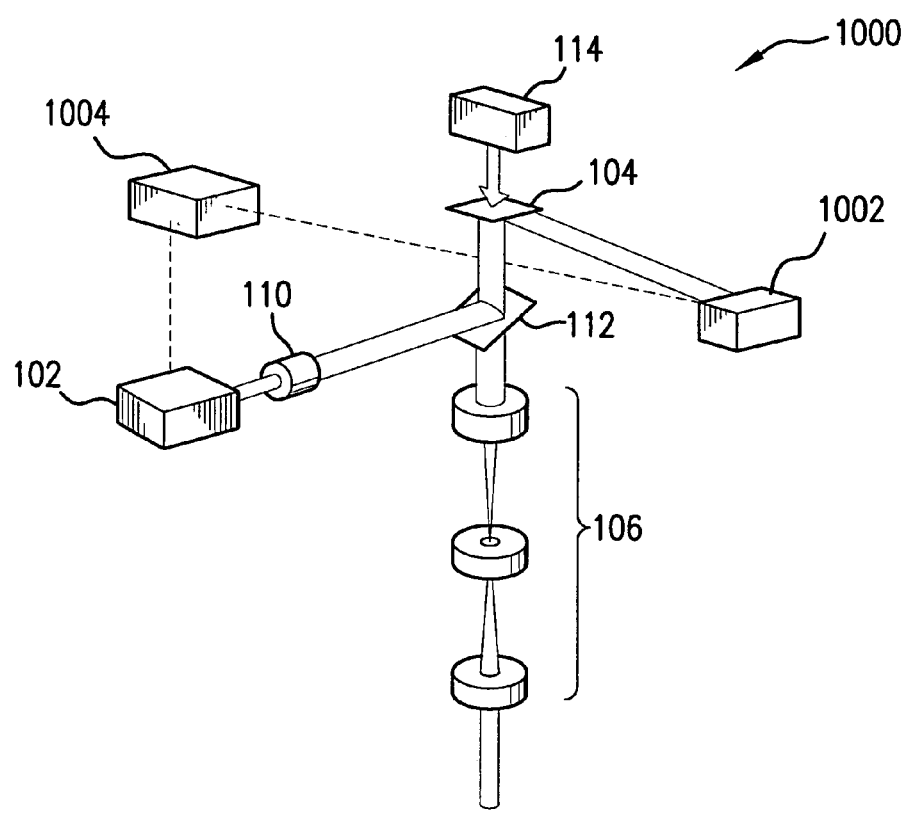
FIG. 10 is a schematic illustration of an illumination intensity monitoring test according to an embodiment of the present invention.

FIGS. 8–10 illustrate various tests that can be performed in accordance with the present invention. In these tests, it is often advantageous to know the X and Y locations of the various spatial light modulator cells in reference to the reference reticle(s).

FIG. 8 is a schematic illustration of a resist image test 800 according to an embodiment of the present invention. In test 800, illumination energy is emitted by illumination source 102 and conditioned by illumination optics 110. The illumination energy is directed to spatial light modulator 104 with beam-splitter 112. A signal is applied to spatial light modulator 104 to form a die pattern of reference features contained on the reference reticle of spatial light modulator 104. Projection optics 106 form a die image with light reflected off the spatial light modulator cells of spatial light modulator 104 and a reference image with light reflected off the reference reticle of spatial light modulator 104, as described herein. Both the die image and the reference image are formed on a wafer 802. The position of the images on wafer 802 are controlled by the position of wafer stage 108. The images on the exposed wafer can be developed and compared to evaluate, for example, the performance of the resist and the wafer stage.

FIG. 9 is a schematic illustration of an aerial image test 900 according to an embodiment of the present invention. In test 900, illumination energy is emitted by illumination source 102 and conditioned by illumination optics 110. The illumination energy is directed to spatial light modulator 104 with beam-splitter 112. A signal is applied to spatial light modulator 104 to form a die pattern of reference features contained on the reference reticle of spatial light modulator 104. Projection optics 106 form a die image with light reflected off the spatial light modulator cells of spatial light modulator 104 and a reference image with light reflected off the reference reticle of spatial light modulator 104, as described herein. In test 900, the die image and the reference image are detected using an image scanner 902. In embodiments, image scanners 902a–d are installed at and can capture images at one or more locations as illustrated in FIG. 9. The locations are preferably proximate to the edge of wafer 802. Movement of the wafer stage 108 in the Z-direction allows an image scanner 902 to capture a three-dimensional image. As would be known to persons skilled in the relevant art(s) given the description herein, by capturing and comparing aerial images of the die image and the reference image, both the optics of tool 100 and the spatial light modulator cells and their related components of tool 100 can be tested and calibrated. Test 900 can be used, for example, to find the best focus of tool 100. In embodiments, test 900 is automatically performed on a periodic basis to keep tool 100 operating as intended. An example comparator/controller 904 is shown in FIG. 2 that automatically adjusts pattern rasterizer 114 based on a comparison of the die image and the reference image. How to implement comparator/controller 904 will be understood by persons skilled in the relevant art(s) given the description herein.

FIG. 10 is a schematic illustration of an illumination intensity monitoring test 1000 according to an embodiment of the present invention. In test 1000, illumination energy is emitted by illumination source 102 and conditioned by illumination optics 110. The illumination energy is directed to spatial light modulator 104 with beam-splitter 112. A signal applied to spatial light modulator 104 tilts the plate containing reference reticle 126 of spatial light monitor 104, thereby reflecting illumination energy incident on the reference reticle towards an illumination monitor 1002. Illumination monitor 1002 can then monitor variations in the illumination energy emitted by illumination source 102 and, if needed, adjust the intensity of the illumination energy emitted by illumination source 102 using an illumination controller 1004. Projection optics 106 form a die image with light reflected off the spatial light modulator cells of spatial light modulator 104, as described herein. Test 1000 allows real time tracking of illumination energy, which can be used to control touchup scans of a wafer.

The tests described herein are illustrative of the power and usefulness of the present invention, and are not intended to limit the present invention. Other tests, including automated periodic tests will become apparent to persons skilled in the relevant art(s) given the description herein.

This disclosure presents a system and method for verifying and controlling the performance of a maskless lithography tool. While various embodiments of the present invention have been described above, it should be understood that they have been presented by way of example only, and not limitation. It will be understood by those skilled in the art that various changes in form and details can be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A maskless lithography system, comprising:
   a spatial light modulator that includes a plurality of spatial light modulator cells;
   a reference reticle having at least one reference feature, the reference reticle located in a plane with the spatial light modulator proximate to one of the plurality of spatial light modulator cells;
   a pattern rasterizer that applies a signal to the spatial light modulator to form a die pattern that includes the at least one reference feature;
   an illumination source that emits illumination energy to illuminate the spatial light modulator and the reference reticle;
   projection optics, having a pupil, that form a die image with illumination energy entering the pupil from the spatial light modulator and a reference image with illumination energy entering the pupil from the reference reticle; and
   a reference reticle postioner that positions the reference reticle to direct incident illumination energy from the illumination source away from the pupil of the projection optics.

2. The system of claim 1, further comprising:
   a image scanner that detects the die image and the reference image formed by the projection optics.

3. The system of claim 2, wherein the die image and the reference image are resist images.

4. The system of claim 2, wherein the die image and the reference image are aerial images.

5. The system of claim 2, further comprising:
   a comparator coupled to the image scanner that compares the die image to the reference image.

6. The system of claim 5, further comprising:
   an adjustment control coupled to the comparator that is adjusted based on an output of the comparator.

7. The system of claim 6, wherein the adjustment control is adjusted at least once during the processing of each lot of substrates.

8. The system of claim 1, further comprising:
   a shutter optically located between the illumination source and the reference reticle that controls the amount of illumination energy incident upon the reference reticle from the illumination source.

9. The system of claim 1, further comprising:
   an illumination monitor that measures the intensity of the illumination energy directed away from the pupil of the projection optics by the reference reticle.

10. The system of claim 9, further comprising:
    an illumination controller coupled to the illumination monitor that adjusts the amount of illumination energy emitted by the illumination source based on an output of the illumination monitor.

11. The system of claim 1, further comprising:
    an illumination monitor that measures the intensity of the illumination energy transmitted through the reference reticle.

12. The system of claim 11, further comprising:
    an illumination controller coupled to the illumination monitor that adjusts the amount of illumination energy emitted by the illumination source based on an output of the illumination monitor.

13. A method for adjusting a maskless lithography system that includes an illumination source, a spatial light modulator, a reference reticle having at least one reference feature, and projection optics having a pupil, comprising:
    (a) illuminating the reference reticle with illumination energy emitted by the illumination source;
    (b) forming a reference image of the at least one reference feature of the reference reticle with illumination energy from the reference reticle that enters the pupil of the projection optics;
    (c) applying a signal to the spatial light modulator to form a die pattern that includes the at least one reference feature;
    (d) illuminating the spatial light modulator with illumination energy emitted by the illumination source while the signal is applied to the spatial light modulator;
    (e) forming a die image of at least one reference feature with illumination energy from the spatial light modulator that enters the pupil of the projection optics;
    (f) comparing the die image of the at least one reference feature to the reference image of the at least one reference feature;
    (g) adjusting the maskless lithography system based on the comparison in step (f); and
    (h) positioning the reference reticle to reflect incident illumination energy from the illumination source away from the pupil of the projection optics.

14. The method of claim 13, further comprising:
    (i) measuring the intensity of the illumination energy reflected from the reference reticle.

15. The method of claim 14, further comprising:
    (j) adjusting the intensity of the illumination energy emitted by the illumination source based on the intensity of the illumination energy measured in step (i).

16. The method of claim 14, further comprising:
    (j) recording the intensity of the illumination energy measured in step (i).

17. The method of claim 13, further comprising:
    (i) measuring the intensity of the illumination energy transmitted through the reference reticle.

18. The method of claim 17, further comprising:
    (j) adjusting the intensity of the illumination energy emitted by the illumination source based on the intensity of the illumination energy measured in step (i).

19. The method of claim 18, further comprising:
(j) recording the intensity of the illumination energy measured in step (i).

20. The method of claim 13, wherein step (f) comprises: comparing resist images.

21. The method of claim 13, wherein step (f) comprises: comparing aerial images.

22. The method of claim 13, wherein the reference reticle and the spatial light modulator are mounted on a movable surface, and the method further comprises:

(h) tilting the movable surface;
(i) observing the reference image of the at least one reference feature to determine the effects of the tilting in step (h), the reference image being an aerial image; and
(j) positioning the movable surface based on the observations of step (i) to achieve a desired telecentricity.

* * * * *

UNITED STATES PATENT AND TRADEMARK OFFICE
CERTIFICATE OF CORRECTION

| | |
|---|---|
| PATENT NO. | : 7,153,616 B2 |
| APPLICATION NO. | : 10/812977 |
| DATED | : December 26, 2006 |
| INVENTOR(S) | : Christopher J. Mason |

It is certified that error appears in the above-identified patent and that said Letters Patent is hereby corrected as shown below:

Column 11
Line 1 please replace "The method of claim 18" with --The method of claim 17--.

Column 12
Line 1 please replace "(h)" with --(i)--.
Line 2 please replace "(i)" with --(j)--.
Line 6 please replace "(j)" with --(k)--.

Signed and Sealed this

Fourth Day of September, 2007

JON W. DUDAS
*Director of the United States Patent and Trademark Office*